(12) United States Patent
Shoji et al.

(10) Patent No.: US 12,073,080 B2
(45) Date of Patent: Aug. 27, 2024

(54) SYSTEM AND METHOD FOR IMPROVING RELIABILITY OF A DATA STORAGE SYSTEM

(71) Applicant: Hitachi, Ltd., Tokyo (JP)

(72) Inventors: Tomoki Shoji, Tokyo (JP); Nagamasa Mizushima, Tokyo (JP)

(73) Assignee: HITACHI, LTD., Tokyo (JP)

( * ) Notice: Subject to any disclaimer, the term of this patent is extended or adjusted under 35 U.S.C. 154(b) by 0 days.

(21) Appl. No.: 17/691,595

(22) Filed: Mar. 10, 2022

(65) Prior Publication Data

US 2023/0152972 A1    May 18, 2023

(30) Foreign Application Priority Data

Nov. 16, 2021   (JP) .................................. 2021-186159

(51) Int. Cl.
*G06F 3/06* (2006.01)
*H03M 7/30* (2006.01)
*H03M 7/40* (2006.01)

(52) U.S. Cl.
CPC .......... *G06F 3/0608* (2013.01); *G06F 3/0638* (2013.01); *G06F 3/0659* (2013.01);
(Continued)

(58) Field of Classification Search
CPC ........ G06F 3/06; G06F 3/0608; G06F 3/0638; G06F 3/0659; G06F 3/0673; H03M 7/3084; H03M 7/3086; H03M 7/4031
See application file for complete search history.

(56) References Cited

U.S. PATENT DOCUMENTS

| | | | |
|---|---|---|---|
| 5,155,484 A | * | 10/1992 | Chambers, IV .... H03M 7/3084 341/55 |
| 5,877,711 A | | 3/1999 | Craft |

(Continued)

FOREIGN PATENT DOCUMENTS

| | | |
|---|---|---|
| JP | H8-55063 | 2/1996 |
| JP | 11-196000 A | 7/1999 |

(Continued)

OTHER PUBLICATIONS

Jeehong Kim and Jundong Cho. 2019., Hardware accelerated Fast Lossless Compression Based on LZ4 Algorithm. In Proceedings of the 2019 3rd International Conference on Digital Signal Processing (ICDSP 2019) Association for Computing Machinery, New York, NY, USA, 65-68.

(Continued)

*Primary Examiner* — Larry T Mackall
(74) *Attorney, Agent, or Firm* — Volpe Koenig

(57) ABSTRACT

Deterioration of compression throughput including a decompression check after data compression is suppressed. Provided is a storage system including an interface and a controller. The controller includes a compression circuit configured to generate compressed data by compressing received data received via the interface; and a decompression circuit configured to decompress the compressed data before storing the compressed data in a storage drive to confirm data consistency. The compression circuit sequentially executes a compression task of the received data, sequentially generates packets of the compressed data, and transfers the packets to the decompression circuit. The decompression circuit decompresses the received packet in parallel with the compression task.

8 Claims, 13 Drawing Sheets

(52) U.S. Cl.
CPC ........ *G06F 3/0673* (2013.01); *H03M 7/3084* (2013.01); *H03M 7/4031* (2013.01)

(56) References Cited

U.S. PATENT DOCUMENTS 5,968,149 A * 10/1999 Jaquette ................ H03M 13/09
710/1
2007/0277036 A1 11/2007 Chamberlain et al.

FOREIGN PATENT DOCUMENTS

| | | |
|---|---|---|
| JP | 2000-188553 A | 7/2000 |
| JP | 2006-526227 A | 11/2006 |
| WO | 2005/026925 A2 | 3/2005 |

OTHER PUBLICATIONS

Japanese Office Action issued on Jan. 9, 2024 for Japanese Patent Application No. 2021-186159.

* cited by examiner

FIG. 12
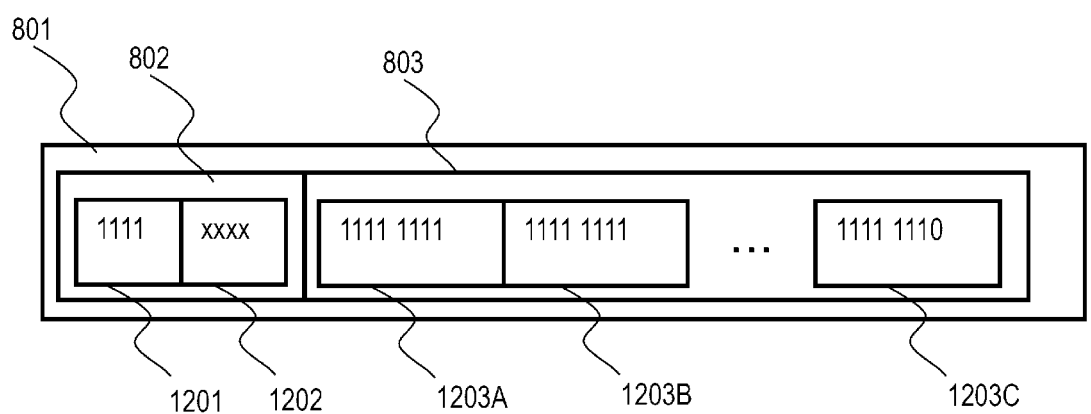
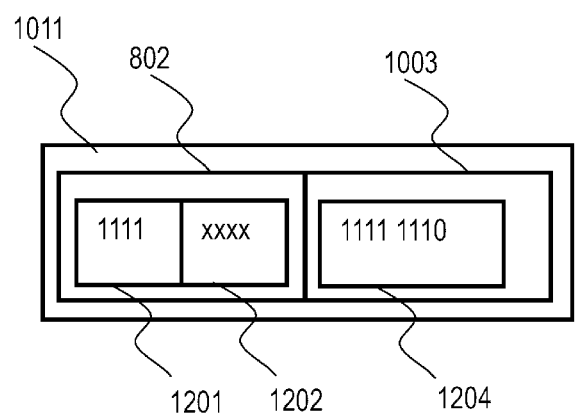

SYSTEM AND METHOD FOR IMPROVING RELIABILITY OF A DATA STORAGE SYSTEM

CLAIM OF PRIORITY

The present application claims priority from Japanese patent application JP 2021-186159 filed on Nov. 16, 2021, the content of which is hereby incorporated by reference into this application.

BACKGROUND OF THE INVENTION

1. Field of the Invention

The present invention relates to data compression in a storage system.

2. Description of the Related Art

Since a storage system needs to manage and accumulate a large amount of data, attention has been paid to a data compression technique that can reduce a cost per system capacity. In the storage system using a data compression function, when a data write request is issued from a host, it is necessary to execute data compression processing in addition to normal write processing, which affects write performance.

In the data compression function of the storage system, in order to ensure reliability of data, it is necessary to decompress data immediately after compression and check whether correct decompressed data is output, as in JP-A-H8-55063 (PTL 1).

An LZ4 algorithm is a reversible data compression algorithm known for a very high calculation speed thereof. This algorithm is a kind of dictionary compression called Lempel-Ziv (LZ) method. When data is compressed, the data is divided into two types of codes called a copy code and a literal code.

The copy code is a code obtained by replacing a certain character string with distance and length information when the certain character string has appeared before, and the literal code is a code obtained by outputting a character string in which a copy code is not found in a non-compressed manner. That is, in the dictionary type compression algorithm, data strings in which each literal code and each copy code are integrated are alternately arranged in data to be compressed.

As described in Jeehong Kim and Jundong Cho. 2019. Hardware-accelerated Fast Lossless Compression Based on LZ4 Algorithm. In Proceedings of the 2019 3rd International Conference on Digital Signal Processing (ICDSP 2019). Association for Computing Machinery, New York, NY, USA, 65-68 (Non-PTL 1), compressed data in the LZ4 algorithm has a format in which a packet including one set of a literal code and a copy code one by one is output as one unit.

Reliability of data can be ensured by decompressing data immediately after compression and performing data check. However, since write performance is further deteriorated as compared with a case where only compression processing is performed, a technique of preventing a deterioration of write performance is important.

SUMMARY OF THE INVENTION

A storage system according to a representative example of the invention includes an interface and a controller. The controller includes a compression circuit configured to generate compressed data by compressing received data received via the interface, and a decompression circuit that decompresses the compressed data before storing the compressed data in a storage drive to confirm data consistency. The compression circuit sequentially executes a compression task of the received data, sequentially generates packets of the compressed data, and transfers the packets to the decompression circuit. The decompression circuit decompresses the received packet in parallel with the compression task.

According to a typical example of the invention, in a storage system having a data compression function, it is possible to prevent deterioration of compression throughput including a decompression check after data compression. Problems, configurations, and effects other than those described above will be clarified from the following description of embodiments.

BRIEF DESCRIPTION OF THE DRAWINGS

FIG. 12 is a diagram showing details of a literal code length section of the LZ4 format according to the second embodiment.

DESCRIPTION OF THE PREFERRED EMBODIMENTS

Figure 1:
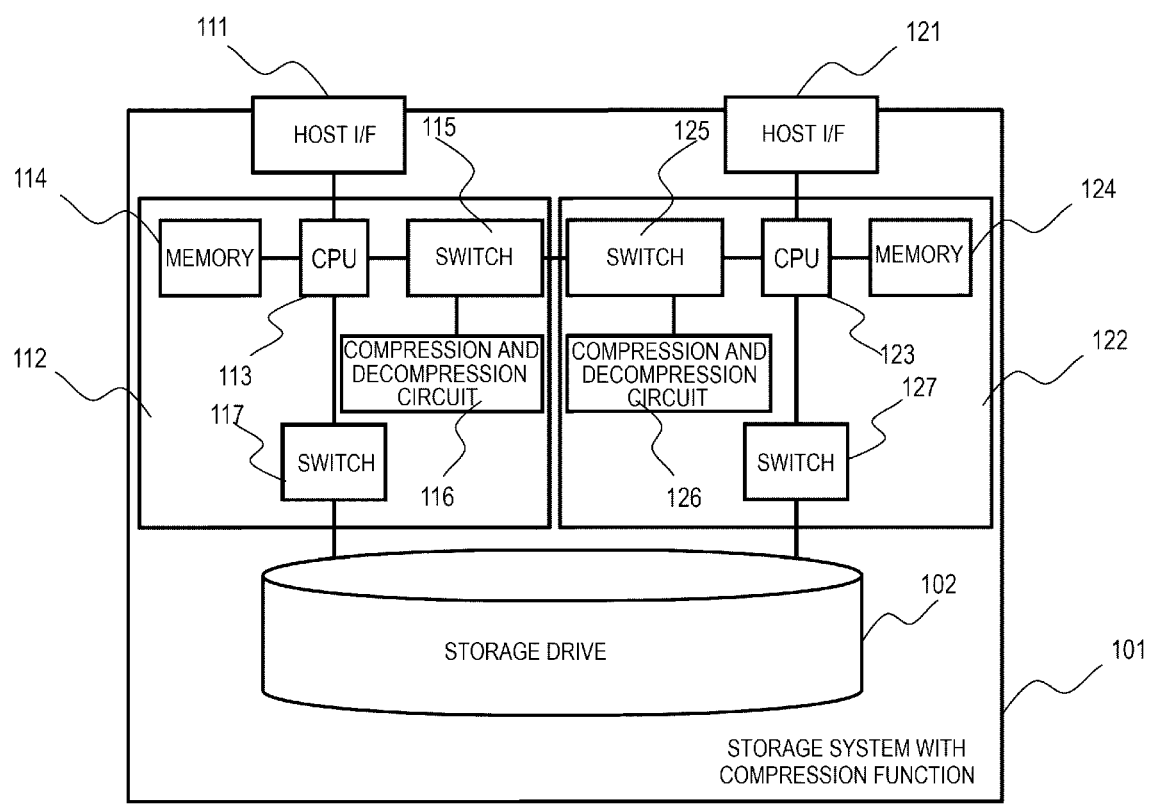
FIG. 1 shows an example of an overall configuration of a storage system to which a data compression system is applied according to a first embodiment.

Hereinafter, an embodiment of the invention will be described with reference to the drawings. The following description and drawings are examples for describing the invention, and are omitted and simplified as appropriate for clarification of the description, the invention can be carried out in various other forms, and each component may be singular or plural unless particularly limited.

The embodiments described below do not limit the invention according to the claims, and all of combinations of components described in the embodiments are not necessarily essential to the solution to the problem.

In the following description, although various types of information may be described by expressions such as "table", "list" and "queue", the various types of information may be expressed by other data structures, and in order to indicate that the information does not depend on the data structure, "table of xxx", "list of xxx", "queue of xxx", and the like may be referred to as "xxx information" or the like. In the following description, when identification information is described, although expressions such as "identification information", "identifier", "name", "ID", and "number" are used, these expressions may be replaced with each other.

In the following description, when there are a plurality of components having the same or similar functions, although the same reference numerals are basically given to the components in the description, means for achieving the functions may be different even if the functions are the same. Further, embodiments of the invention to be described later may be implemented by software running on a general-purpose computer, or may be implemented by dedicated hardware or a combination of software and hardware.

In the following description, although processing may be described with a "program" as a subject, since a program is executed by a processor (for example, a central processing unit (CPU)), predetermined processing is appropriately performed using a storage device (for example, a memory) and/or an interface device (a communication port), and thus a subject of the processing may be described as a processor.

The processing described using the program as the subject may be processing performed by a computer (for example, a calculation host or a storage device) including a processor. In the following description, the term "controller" may refer to a processor or a hardware circuit that performs a part or all of processing performed by the processor.

The program may be installed in each computer from a program source (for example, a program distribution server or a storage medium readable by a computer), and in this case, the program distribution server may include a CPU and a storage resource, the storage resource may further store a distribution program and a program to be distributed, and the CPU of the program distribution server may distribute the program to be distributed to another computer by executing the distribution program.

The storage system described below has a data compression function. The storage system compresses received data to generate compressed data, and stores the compressed data in a storage drive. The storage system decompresses the compressed data before storing the decompressed data in the storage drive, and checks consistency between pre-compression data and the decompressed data. Thereby, high reliability can be ensured.

The storage system includes a compression circuit that compresses data and a decompression circuit that decompresses the compressed data. These can be operated in parallel. The compression circuit sequentially generates packets of compressed data and transmits the packets to the decompression circuit. The decompression circuit executes the decompression processing of the packets in parallel with the compression processing of the compression circuit. Accordingly, it is possible to prevent deterioration of compression throughput including decompression check after the data compression, and to guarantee predetermined write performance of the storage system.

First Embodiment

FIG. 1 shows an example of an overall configuration of a storage system with a compression function according to an embodiment of the description. A storage system 101 has a dual controller configuration in which a storage controller 112 and a storage controller 122 are mounted.

The storage controller 112 is connected to a host interface (I/F) 111, communicates with a host (not shown), includes a switch 117, and communicates with a plurality of storage drives 102. As the storage drive 102, for example, a hard disk drive (HDD) or a solid state drive (SSD), which is a nonvolatile storage drive, can be used.

The storage controller 112 further includes a CPU 113 for controlling data transmitted to and received from the host and the storage system 101, a memory 114 of the CPU 113, and a switch 115 for connecting the storage controller 112 and the storage controller 122.

The CPU 113 is a processor, includes one or a plurality of cores, and implements a predetermined function by operating in accordance with a program stored in the memory 114. For example, a volatile memory such as a DRAM can be used as the memory 114. The storage controller 112 further includes a compression and decompression circuit 116 and is connected to the switch 115.

Hardware configurations of the storage controller 112 and the storage controller 122 are the same, and detailed description of the storage controller 122 is omitted. The storage controller 122 includes a switch 127, a CPU 123, a memory 124, a switch 125, and a compression and decompression circuit 126. In the configuration example of FIG. 1, although the compression and decompression circuit 126 is mounted in the storage controller, the compression and decompression circuit 126 may be mounted in a drive box (not shown) accommodating the storage drive 102.

Figure 2:
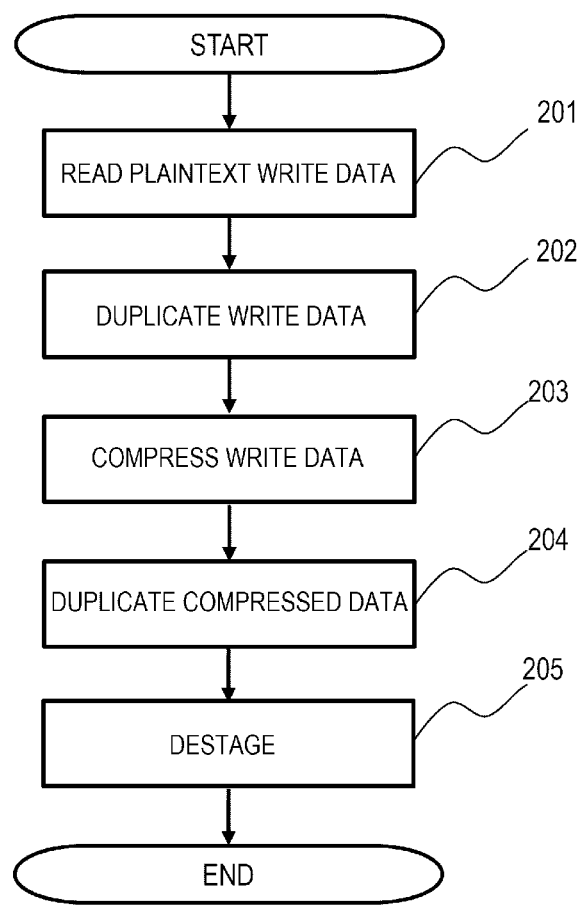
FIG. 2 shows an example of a host write processing flow of the storage system according to the first embodiment.
Figure 3:
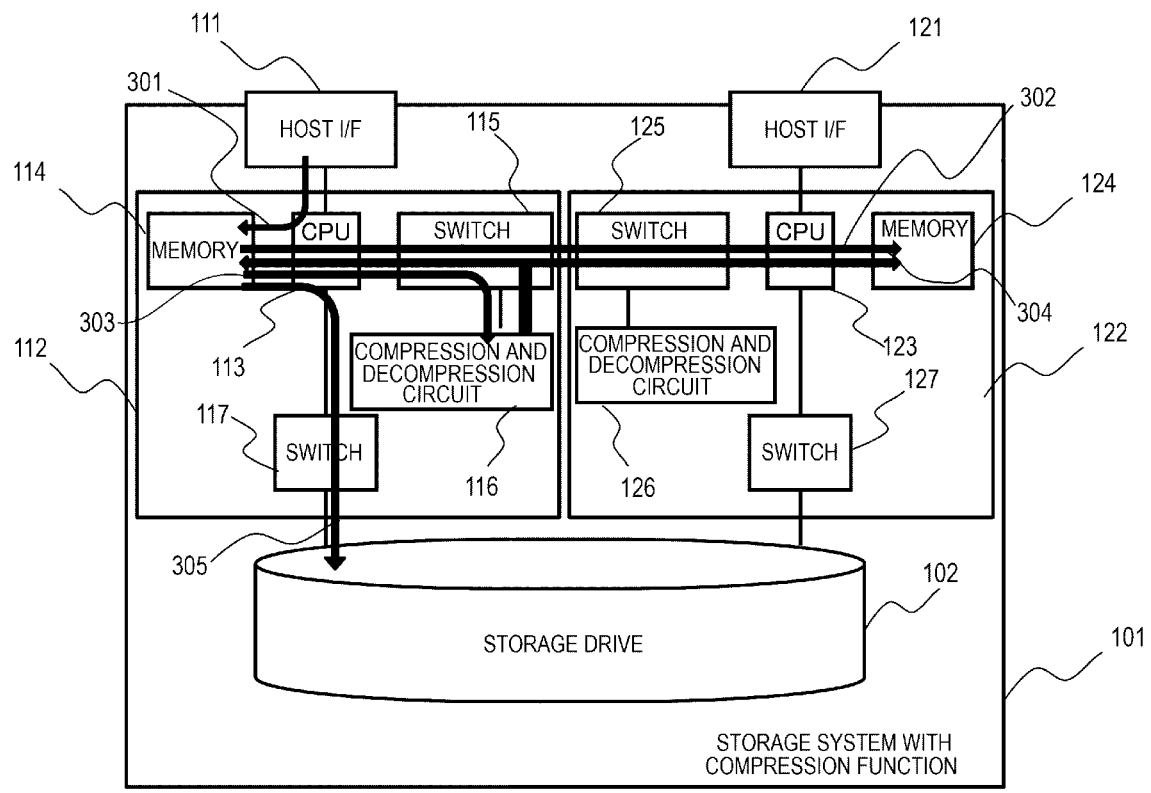
FIG. 3 shows an example of a data flow of host write processing of the storage system according to the first embodiment.

Host write processing when the compression function is operated in the storage system 101 will be described with reference to FIGS. 2 and 3. FIG. 2 shows an operation flow of the host write processing including the compression function operation of the storage system 101. FIG. 3 shows a data flow in the storage system 101 shown in the processing flow of FIG. 2.

In a data flow 301 in FIG. 3, the CPU 113 of the storage controller 112 stores plaintext write data from the host I/F 111 into the memory 114 (step 201 in FIG. 2).

In a data flow 302 in FIG. 3, the CPU 113 duplicates the plaintext write data stored in the memory 114 in the memory 124 of the storage controller 122 through the switch 115, the switch 125, and the CPU 123 (step 202 in FIG. 2).

In a data flow 303 in FIG. 3, the CPU 113 transfers the plaintext write data stored in the memory 114 to the compression and decompression circuit 116 through the switch 115, and the compression and decompression circuit 116 compresses the transferred data (step 203 in FIG. 2).

In the data flow 304 in FIG. 3, the compression and decompression circuit 116 returns the compressed write data to the memory 114 of the storage controller 112, and at the same time, transfers the compressed write data to the memory 124 of the storage controller 122 to perform duplication (step 204 in FIG. 2).

In a data flow 305 in FIG. 3, the CPU 113 writes the compressed write data stored in the memory 114 into the storage drive 102 through the switch 117 (step 205 in FIG. 2).

Figure 4:
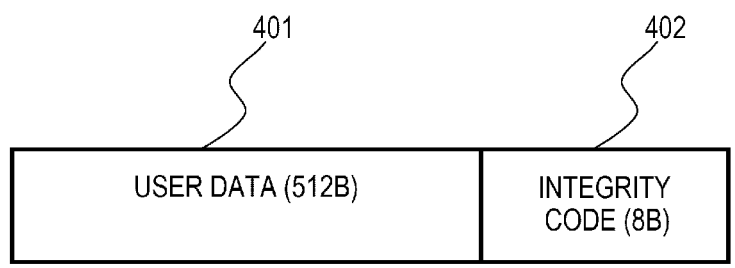
FIG. 4 shows an example of a data structure with a integrity code in write processing of the storage system according to the first embodiment.

FIG. 4 shows user data and a integrity code assigned to the user data in the storage system 101. The integrity code 402 is added as 8B for each 512B of user data 401. In the host write processing, the storage system 101 receives the user data 401 from the host, and adds the integrity code 402 to the user data 401 via the host I/F 111 of the data flow 301.

Figure 5:
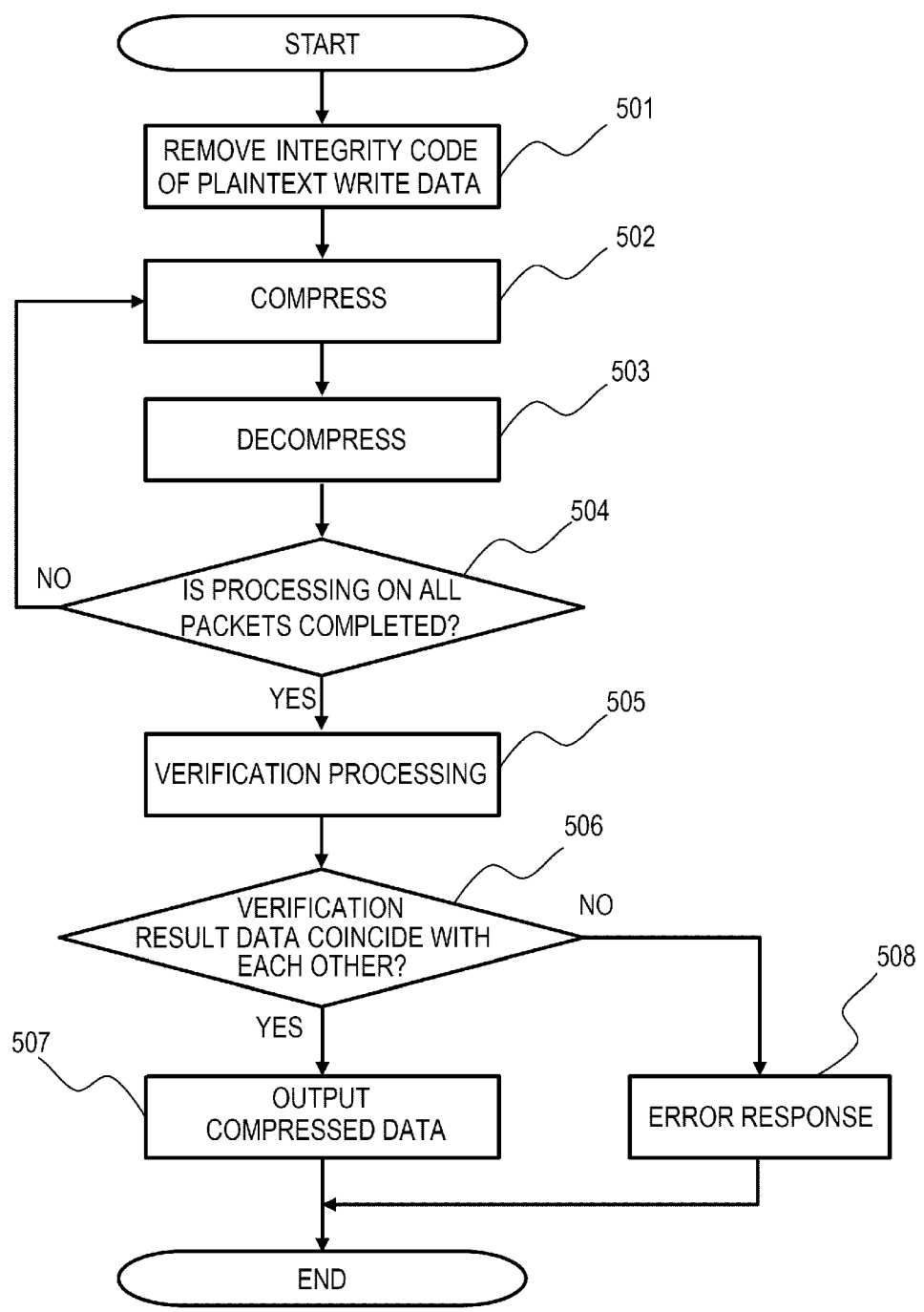
FIG. 5 shows an example of a flowchart of processing of performing a decompression check on compressed data according to the first embodiment.

FIG. 5 shows a processing flow of performing decompression check processing of compressed data inside the compression and decompression circuit 116 when the compression function is operated in the host write processing of the storage system 101. In the decompression check processing, consistency between the decompressed data and the pre-compression data is confirmed. The user data to which the integrity code is added is plaintext write data to be compressed and decompressed by the compression and decompression circuit 116.

In step 501, the compression and decompression circuit 116 removes the integrity code of the plaintext write data and extracts only the user data to be compressed. In step 502, the compression and decompression circuit 116 compresses the plaintext write data. The compressed data is output in units of packets.

In step 503, the compression and decompression circuit 116 decompresses the compressed data for each packet. The compression and decompression circuit 116 repeats compression and decompression in units of packets, and determines in step 504 whether similar processing was completed for all plaintext write data. When the processing is not completed (504: NO), the flow returns to step 502.

When the decompression of all the compressed data is completed (504: YES), in step 505, the compression and decompression circuit 116 performs verification processing to determine whether the decompressed data matches original plaintext write data.

As a result of the verification, when it is confirmed that the decompressed data matches the plaintext write data and the data is correctly compressed (506: YES), the compression and decompression circuit 116 outputs the compressed data in step 507, and completes the decompression check processing of the compressed data. When the decompressed data and the plaintext write data do not match (506: NO), the compression and decompression circuit 116 returns an error response in step 508, and completes the decompression check processing of the compressed data.

Figure 6:
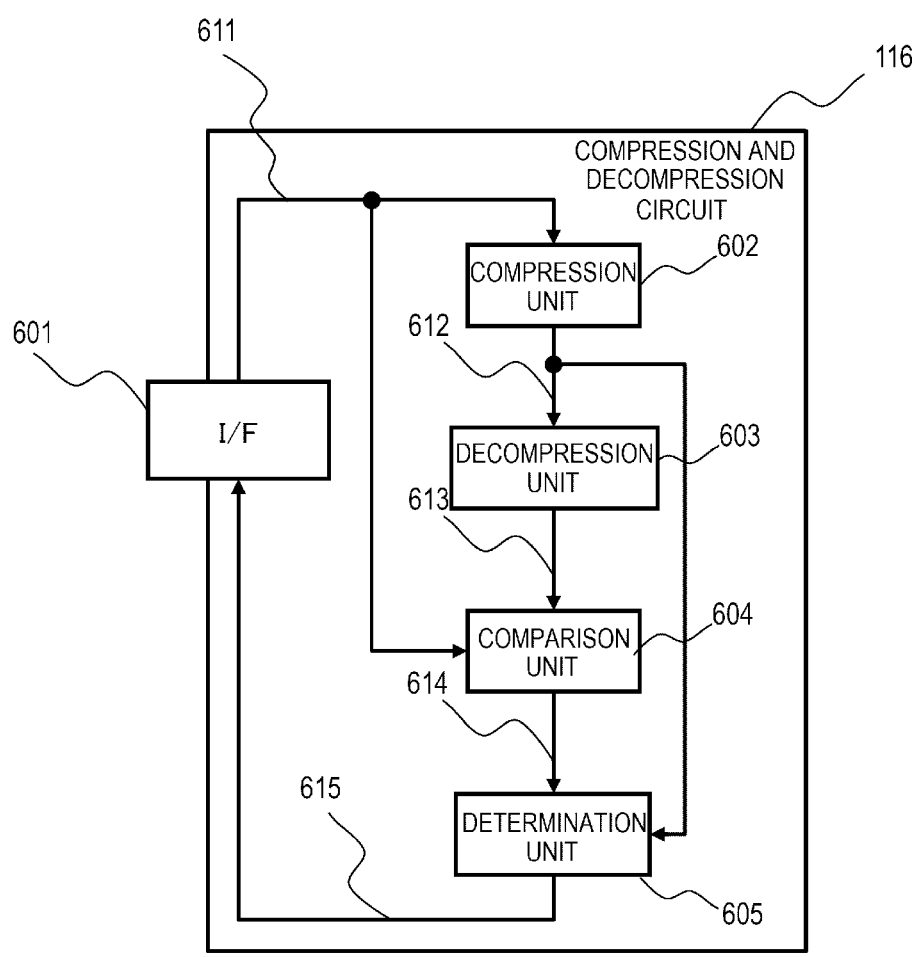
FIG. 6 shows an example of an internal block of a compression and decompression circuit of the storage system according to the first embodiment.

FIG. 6 shows an example of an internal circuit configuration of the compression and decompression circuit 116. The compression and decompression circuit 116 includes an I/F 601, a compression unit 602, a decompression unit 603, a comparison unit 604, a determination unit 605, and signal lines 611 to 615. In the present embodiment, the compression unit (compression circuit) 602, the decompression unit (decompression circuit) 603, the comparison unit 604, and the determination unit 605 are mounted as different circuits.

The I/F 601 transmits a plaintext to the compression unit 602 through the signal line 611. The compression unit 602 compresses the data and outputs the compressed data to the decompression unit 603 through the signal line 612. The decompression unit 603 decompresses the compressed data and outputs the decompressed data to the comparison unit 604 through the signal line 613.

The comparison unit 604 receives the plaintext before compression from the I/F 601 through the signal line 611, and further compares the plaintext with the decompressed data received from the decompression unit 603 through the signal line 613 to confirm the match between the data. The comparison unit 604 further outputs the result of the comparison of the data to the determination unit 605 through the signal line 614.

The determination unit 605 receives a confirmation result of the comparison unit 604. When the determination unit 605 confirms that the data match, the determination unit 605 outputs the compressed data received from the compression unit 602 through the signal line 612 to the I/F 601 through the signal line 615. When a mismatch of data is detected, the determination unit 605 returns an error response to the I/F 601 through the signal line 615.

Figure 7:
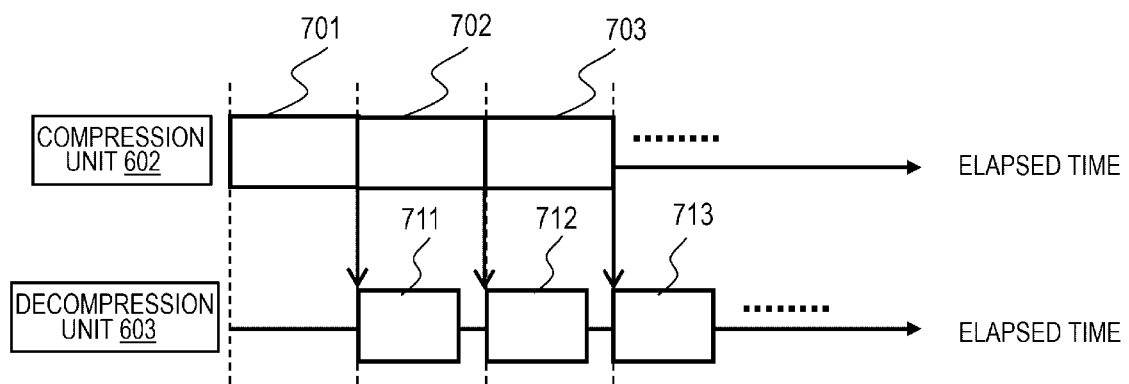
FIG. 7 shows an example of a parallel operation of a circuit that performs decompression check on compressed data according to the first embodiment.

Since the compression unit 602, the decompression unit 603, the comparison unit 604, and the determination unit 605 are independent of each other, they can operate in parallel. FIG. 7 is a time chart when the compression unit 602 and the decompression unit 603 are operated in parallel. The compression unit 602 outputs the compressed data divided into units of packets in a stepwise manner.

A task 701 indicates time until the first packet of the compressed data is output. When the first packet is output in the task 701, the compression unit 602 starts a task 702 indicating compression processing of a next packet. At the same time, the first packet of the compressed data is passed to the decompression unit 603, and the task 702 of the compression unit 602 and a task 711 of the decompression unit 603 operate in parallel. Similarly, when the compression unit 602 completes the processing of the task 702, the compression unit 602 starts the task 703, the decompression unit 603 starts the task 712, and the compression unit 602 and the decompression unit 603 operate in parallel.

As described above, the present embodiment includes the compression unit and the decompression unit that can operate independently, and executes the compression processing and the decompression processing in units of packets. Accordingly, the compression unit and the decompression unit are operated in parallel, and a total processing time of the compression unit and the decompression unit can be shortened.

Second Embodiment

Figure 8:
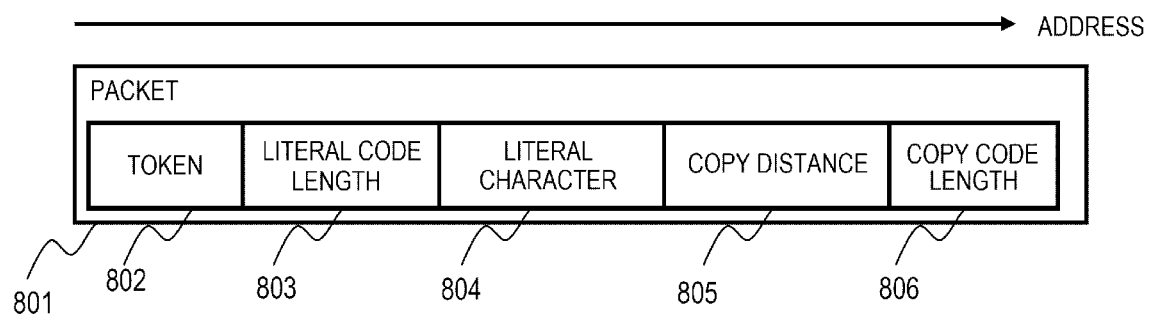
FIG. 8 shows a general LZ4 format according to a second embodiment.

Hereinafter, LZ4 will be described as an example of a data compression algorithm. Features of the embodiments of the present specification including the present embodiment and other embodiments can be applied to a compression algorithm of a type different from LZ4. FIG. 8 shows an LZ4 format that is used as a standard. Hereinafter, the LZ4 format that is used as a standard is referred to as a standard LZ4. The compressed data of the standard LZ4 is divided into units of packets, and each packet is output as soon as compression of each packet is completed. The packet 801 is one packet of the standard LZ4 format.

One set of a literal code and a copy code is stored in the packet 801 one by one. The literal code is obtained by encoding a character string of the user data as it is, and the copy code is a code indicating repetitive data in the user data. A specific data section in a packet will be described below. A token section 802 is a 1-byte section where length information of each of the literal code and the copy code is four bits. The length information of the code stored in the token section 802 can be stored up to a code length of up to 15 characters for each of the literal code and the copy code.

Therefore, when the length of each of the literal code and the copy code exceeds 15 characters, data sections of a literal code length section 803 and a copy code length section 806 are additionally inserted into the packet, and even a long literal code length and a long copy code length can be expressed.

A literal character section 804 is a data section in which the literal characters of the literal codes are stored in a non-compressed manner as many as the sum of the lengths of the literal codes stored in the token section 802 and the literal code length section 803. In a copy distance section 805, distance information of the copy code is stored in 2 bytes.

In the packet 801, a portion indicating information of the literal code is a literal code unit, and a portion indicating information of the copy code is a copy code unit. The literal code unit includes a part of the token section 802, the literal code length section 803, and the literal character section 804. The copy code unit includes another part of the token section 802, the copy distance section 805, and the copy code length section 806.

Figure 9:
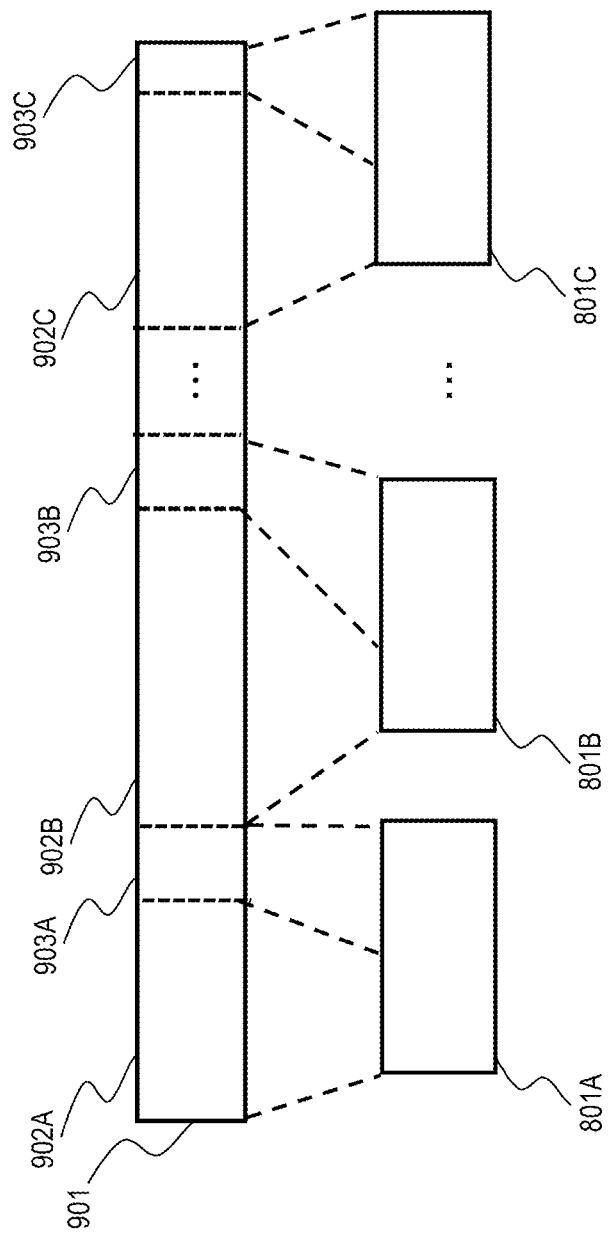
FIG. 9 shows an example of a general LZ4 compressed data pattern according to the second embodiment.

FIG. 9 shows a compressed data pattern when user data 901 is compressed by the standard LZ4. The user data 901 is data obtained by removing the integrity code 402 from the plaintext write data and extracting and aligning only the user data 401. When the user data 901 is compressed by LZ4, the user data 901 has a format in which literal code sections 902A, 902B, and 902C and copy code sections 903A, 903B, and 903C are alternately aligned according to the principle of dictionary compression. However, the literal code does not necessarily exist between the copy code sections. For example, there is a case where the literal code section 902B does not exist in the user data 901, and the copy code sections 903A and 903B are continuous.

When the user data 901 divided into the literal code section and the copy code section is encoded into compressed data of the standard LZ4, the user data 901 is divided into packet units of the packets 801A, 801B, and 801C.

The packet 801A includes one literal code section 902A and one copy code section 903A for a section obtained by dividing the user data 901 into a literal code section and a copy code section. Since the same applies to the packet 801B and the packet 801C, the description thereof will be omitted. However, as described above, when there is a data section in which the copy code sections are continuous in the user data 901, the packet 801 of the standard LZ4 does not include the literal code, and only the copy code section is encoded and stored.

In the second embodiment, parallel operability of the compression unit 602 and the decompression unit 603 is further enhanced by limiting a processing amount per packet in the compression in step 502 in the first embodiment.

Figure 10:
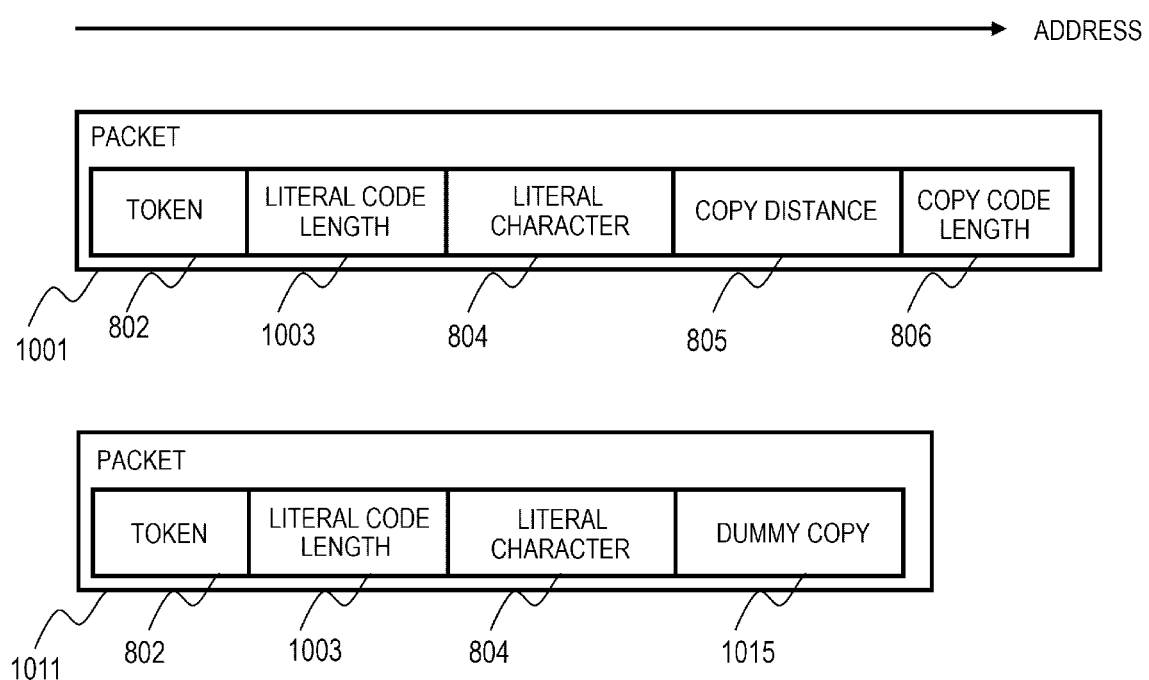
FIG. 10 shows an LZ4 format according to the second embodiment of the invention.

Hereinafter, the second embodiment will be described with reference to FIGS. 10 to 13. In the second embodiment, as shown in FIG. 10, two LZ4 packet formats newly defined in the present embodiment are used. FIG. 10 shows packets 1001 and 1011 conforming to these two packet formats. Hereinafter, the LZ4 format newly defined in the present embodiment is referred to as LZ4 according to the present embodiment. The LZ4 according to the present embodiment is characterized in that an upper limit value is set to the literal code length in the packet.

A difference between the packet 801 of the standard LZ4 and the packet 1001 of the first format of the LZ4 of the present embodiment is as follows. The upper limit value is not set to the literal code length of the literal code length section 803 of the packet 801. On the other hand, the upper limit value is set to the literal code length of a literal code length section 1003 in the packet 1001. The other sections in the packet have the same format.

The packet 1011 of a second format of LZ4 according to the present embodiment defines a "dummy copy code", which is a code indicating that nothing is copied (no copy), in the standard LZ4 packet format. The dummy copy code is configured with, for example, the copy distance section 805, and the copy distance area 805 indicates 0. In another example, the copy distance section 805 and the copy code length section 806 may be configured, and both the copy distance section 805 and the copy code length section 806 may indicate 0. When the length of the literal code exceeds the upper limit value of the literal code length section 1003 in the packet 1001, a compressed data packet is output according to the second format indicated by the packet 1011. The dummy copy code is a portion indicating the second format.

In the packet 1011, when the section encoded into the literal code in the user data exceeds the upper limit value of the number of characters that can be expressed by the literal code length section 1003 of LZ4 according to the present embodiment, the character (literal code) of the defined upper limit value is stored in the literal code length section 1003 and is output. That is, in the packet 1011, since all of the consecutive literal code sections in the user data cannot be completely contained in the packet, the separation of the packet is expressed by the dummy copy code 1015 to which nothing is copied, and the packet 1011 is output. Then, in the compression processing of generating the next packet, the encoding is performed from the literal code which is not yet encoded in the middle of the user data.

Figure 11:
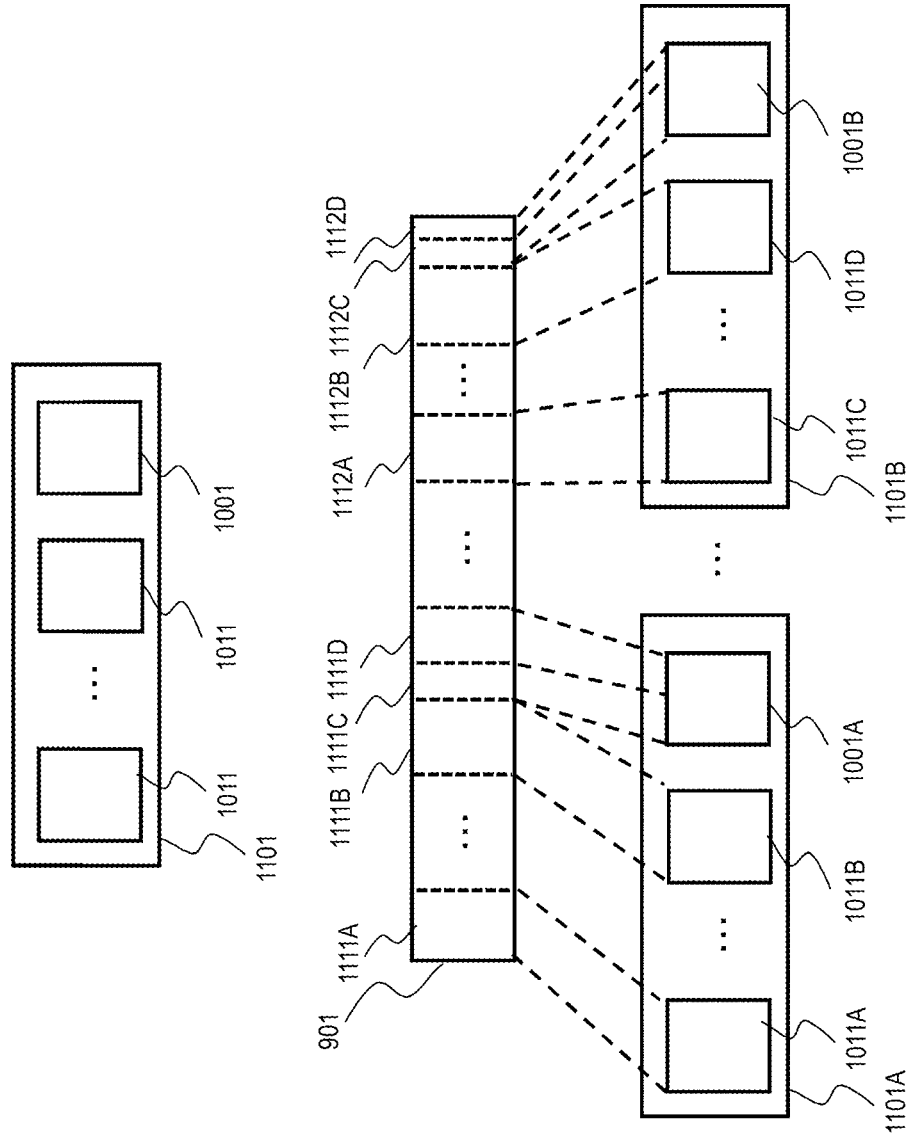
FIG. 11 shows an example of the LZ4 compressed data pattern according to the second embodiment of the invention.

FIG. 11 shows a compressed data pattern when the user data 901 is compressed by LZ4 according to the present embodiment. A group 1101 of packets is a form indicating a pattern of packets of data compressed by LZ4 according to the present embodiment. The group 1101 of packets includes the plurality of aligned packets 1011 and the packet 1001 at an end position.

When the user data 901 is divided by the LZ4 code section according to the present embodiment, the user data 901 includes the literal code section in which a literal code section 1111A to a literal code section 1111B having a literal code upper limit value of LZ4 of the present embodiment as a data length are continuously arranged, and then includes a literal code section 1111C in which a data length is equal to or less than an upper limit value of one packet, and a copy code section 1111D.

A packet 1011A encodes the literal code section 1111A of the user data 901. A packet 1011B encodes the literal code section 1111B of the user data 901. Several packets 1011 having a fixed literal code length and a dummy copy code are arranged between the packets 1011A and 1011B.

A packet 1001A encodes the literal code section 1111C having a data length equal to or less than the upper limit of the literal code length and the copy code section 1111D included in LZ4 of the present embodiment. A group 1101A of packets includes several packets 1011 from the packet 1011A to the packet 1011B, and the packet 1001A.

The group 1101 of packets is a group of packets each including one literal code and one copy code. The entire compressed data has a format in which the formats of the group 1101 of packets are sequentially arranged. The group 1101 of packets may have a configuration in which only one packet 1001 is included depending on the pattern of the user data 901 to be compressed.

A method of expressing the literal code length of the standard LZ4 and a method of determining the upper limit value of the literal code length of the LZ4 according to the present embodiment based on the expressing method will be described with reference to FIG. 12. FIG. 12 is a detailed description of a data format of the token section 802 and the literal code length section 803. In the 1-byte section of the token section 802, an upper 4-bit data section 1201 is a section indicating the literal code length, and a lower 4-bit data section 1202 is a section indicating the copy code length. Hereinafter, the data section 1201 is referred to as a token literal code length section 1201, and the data section 1202 is referred to as a token copy code length section 1202.

When the length of the literal code is within the range that can be expressed by the token literal code length section 1201, the literal code length section 803 is not inserted into the packet 801. When all the values of the four bits of the token literal code length section 1201 become 1, that is, when the value becomes a maximum value that can be expressed by four bits, the literal code length 803 is inserted.

In the literal code length section 803, the data length is added one byte at a time. A literal code length byte 1203A is the first byte added to the literal code length section 803. The literal code length byte 1203A can express up to the number of characters of one byte, that is, 255 characters.

When the number of literal code characters exceeds the number of characters that can be expressed by combining the token literal code length section 1201 and the literal code length byte 1203A, that is, when all the bits of the token literal code length section 1201 and the literal code length byte 1203A indicate "1", a literal code length byte 1203B is further added to the literal code length section 803.

As described above, in the literal code length section 803, data of one byte is added to the literal code length section 803 for every 255 characters of a continuous literal code. Finally, as in a literal code length byte 1203C, when all the bits of the one-byte section are not filled with "1", the literal code length byte 1203C is regarded as the end of the data section of the literal code length section 803.

As described above, in a literal code length byte 1203 of LZ4, a maximum value that can be taken without adding the literal code length byte 1203 to the next section is a bit string "1111 1110".

Also in the LZ4 packet 1011 of the present embodiment, since the above rule is followed, it is possible to maximize a code efficiency of the literal code length by setting the maximum value of a value of the last byte of a predetermined upper limit number of bytes of the literal code length section 1003 to the bit string "1111 1110".

For example, when the maximum number of bytes of the literal code length section 1003 is set to 1, the only component of the literal code length section 1003 is a literal code length byte 1204. The literal code length byte 1204 has the best code efficiency when the maximum value is set to "1111 1110". In this case, the maximum value of the literal code length that can be stored in the packet 1011 is a sum of the maximum value "1111" (=15) of the token literal code length section 1201 and the maximum value "1111 1110" (=254) of the literal code length section 1003, and it is possible to store the literal code of 269 characters per packet of LZ4 of the present embodiment.

Figure 13:
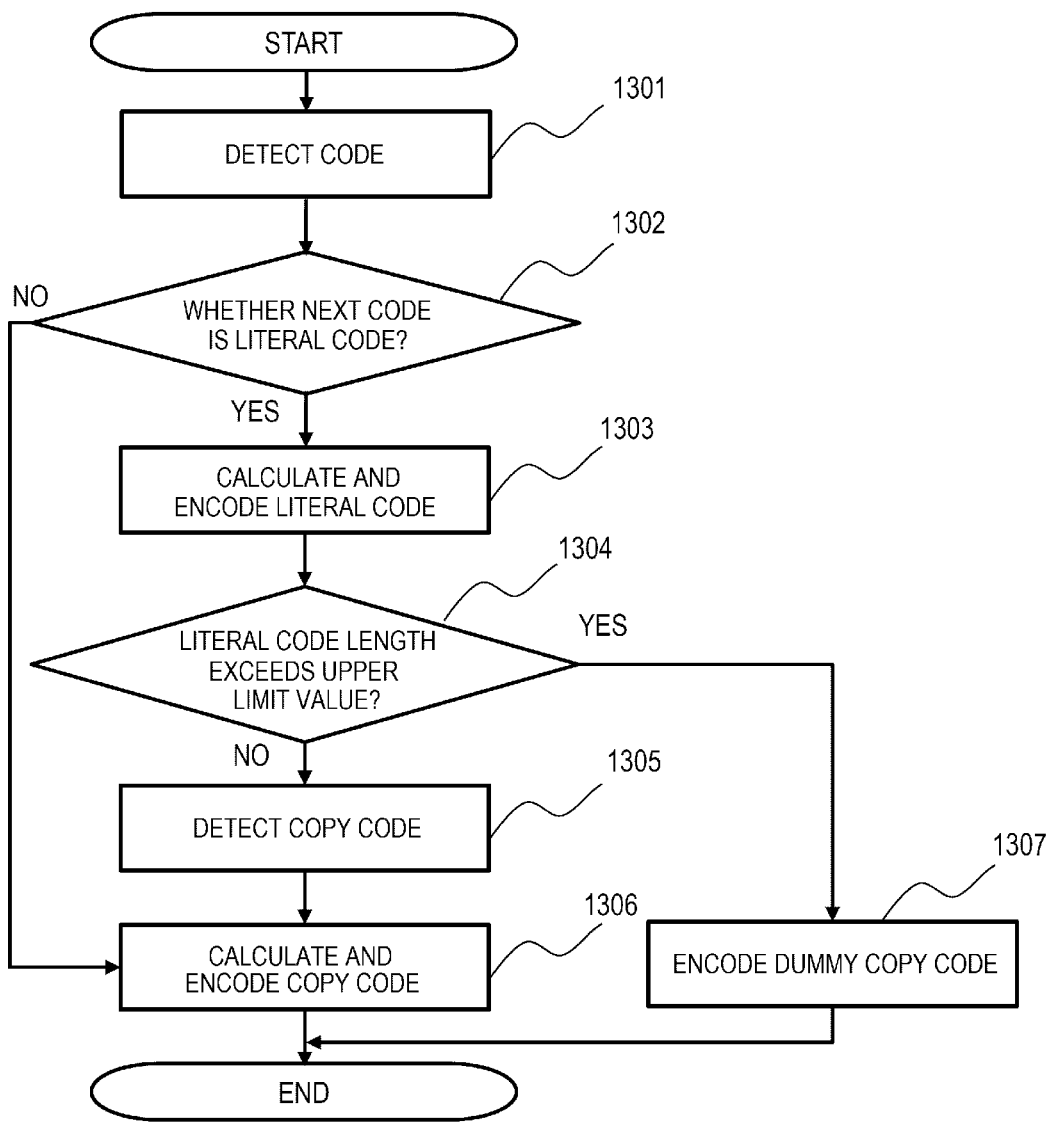
FIG. 13 shows an example of a flowchart of compression processing for each packet of LZ4 according to the second embodiment of the invention.

FIG. 13 shows a detailed compression processing flow per packet in step 502 of FIG. 5 when LZ4 of the present embodiment is used in the compression unit 602 of the compression and decompression circuit 116. In step 1301, the compression unit 602 reads the plaintext write data from a next position of the position encoded in previous packet, and detects the code.

In step 1302, the compression unit 602 determines whether the detected code is a literal code or a copy code. When the detected code is the literal code (1302: YES), the compression unit 602 calculates the literal code and encodes the literal code in the section indicating the literal code of the packet 1001 or the packet 1011. When the detected code is the copy code (1302: NO), the compression unit 602 writes a code indicating that the literal code length is 0 in the token literal code length section 1201, calculates the copy code, and encodes the copy code in the section indicating the copy code of the packet 1001.

When the literal code length is calculated and encoded in step 1303, the compression unit 602 determines whether the literal code length of the remaining data to be encoded exceeds the upper limit literal code length set in the packet in step 1304.

When the literal code length is equal to or less than the upper limit value (1304: NO), the compression unit 602 detects and encodes the copy code. When the copy code is encoded in step 1305, the compressed data packet is output in the format of the packet 1001. When the literal code length is larger than the upper limit value (1304: YES), the compression unit 602 encodes the dummy copy code. In step 1307, when the dummy copy code is encoded, the compressed data packet is output in the format of the packet 1011.

As described above, by using the LZ4 format of the present embodiment, it is guaranteed that each packet of the compressed data in the LZ4 algorithm is output within a certain period of time, and the parallel operability of the compression unit 602 and the decompression unit 603 can be enhanced.

Since the LZ4 format of the present embodiment has a small change from the standard LZ4 as described above, the LZ4 format can be implemented with a few man-hours for mounting.

The storage system 101 may monitor the compression processing in the compression and decompression circuits 116 and 126 and change the upper limit literal code length based on the compression processing performance. For example, the CPUs 113 and 123 monitor a compression rate and/or a compression speed in the compression and decompression circuits 116 and 126, and manage the information in the memories 114 and 124. A circuit for changing the upper limit literal code length may be incorporated in the compression and decompression circuits 116 and 126.

The CPU 113 or 123 calculates statistical values of the compression rate and/or the compression speed of both of the compression and decompression circuits 116 and 126 at a predetermined timing. The statistical value may be, for example, an average value. For example, when the calculated compression rate is less than a threshold, the CPU 113 or 123 increases the upper limit value by a predetermined number. Alternatively, when the calculated compression speed is less than a threshold, the CPU 113 or 123 decreases the upper limit value by a predetermined number.

As described above, the compression unit sequentially generates packets such that at least a part of the packets has a size equal to or smaller than a preset upper limit value. In the above example, the upper limit value is set to the literal code length. A part in which the upper limit value is set may be appropriately set in accordance with a packet format and a system design. By limiting the literal code length of the compressed packet to the upper limit or less, compression time of each packet is limited, and parallel processing of compression and decompression can be performed more effectively.

Third Embodiment

In the present embodiment, a higher compression rate is realized by changing the format of the LZ4 packet of the second embodiment. Changes from the second format of LZ4 and the compression processing flow according to the second embodiment will be described below with reference to FIGS. 14 and 15.

Figure 14:
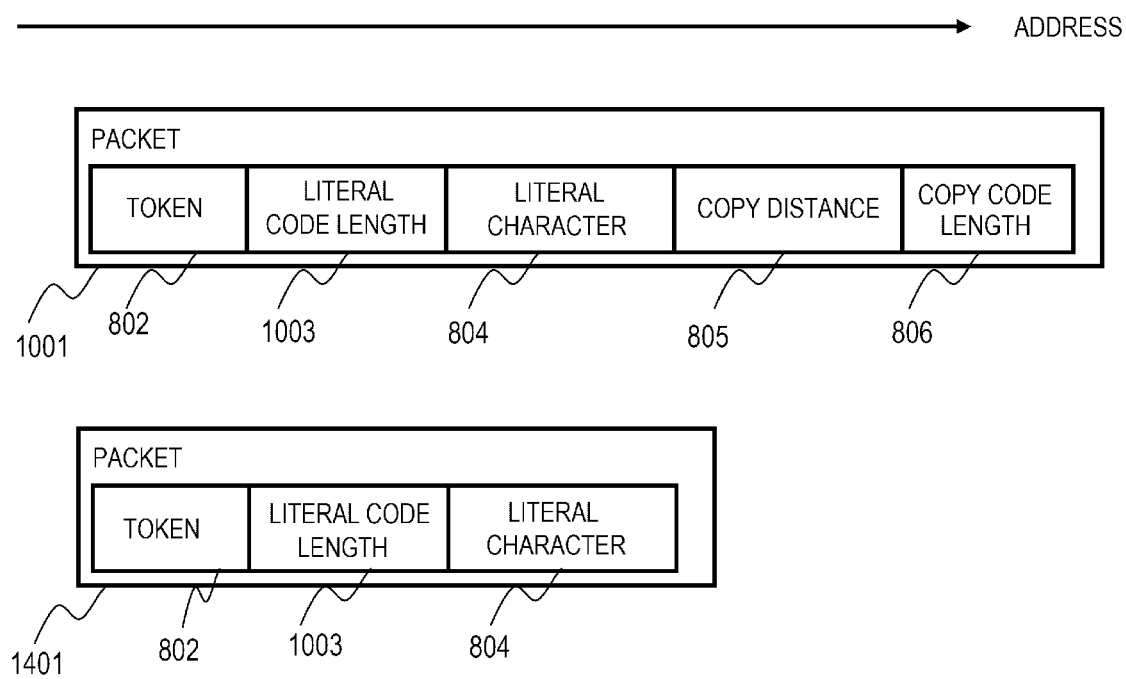
FIG. 14 shows an LZ4 format according to a third embodiment of the invention.

FIG. 14 is a second format of LZ4 defined in a third embodiment. The literal code length does not become the upper limit value, and there is no change point in the packet 1001 in which the literal code and the copy code are stored. In a packet 1401, the dummy copy code is not defined for the packet 1011, and the packet 1401 is configured by three data sections of the token section 802, the literal code length section 1003, and the literal character section 804.

In the packet 1011, by inserting a dummy copy code into a packet, a separation of the packet is clearly indicated. On the other hand, in the packet 1401, the token copy code length section 1202 in the token section 802 indicates whether a copy code is stored in the packet. That is, when the copy code length indicated by the token copy code length section 1202 is 0, it indicates that the copy code is not stored in the packet. As described above, a packet separation position can be determined with reference to the token copy code length section 1202. The token copy code length section 1202 is a portion indicating the second format.

Figure 15:
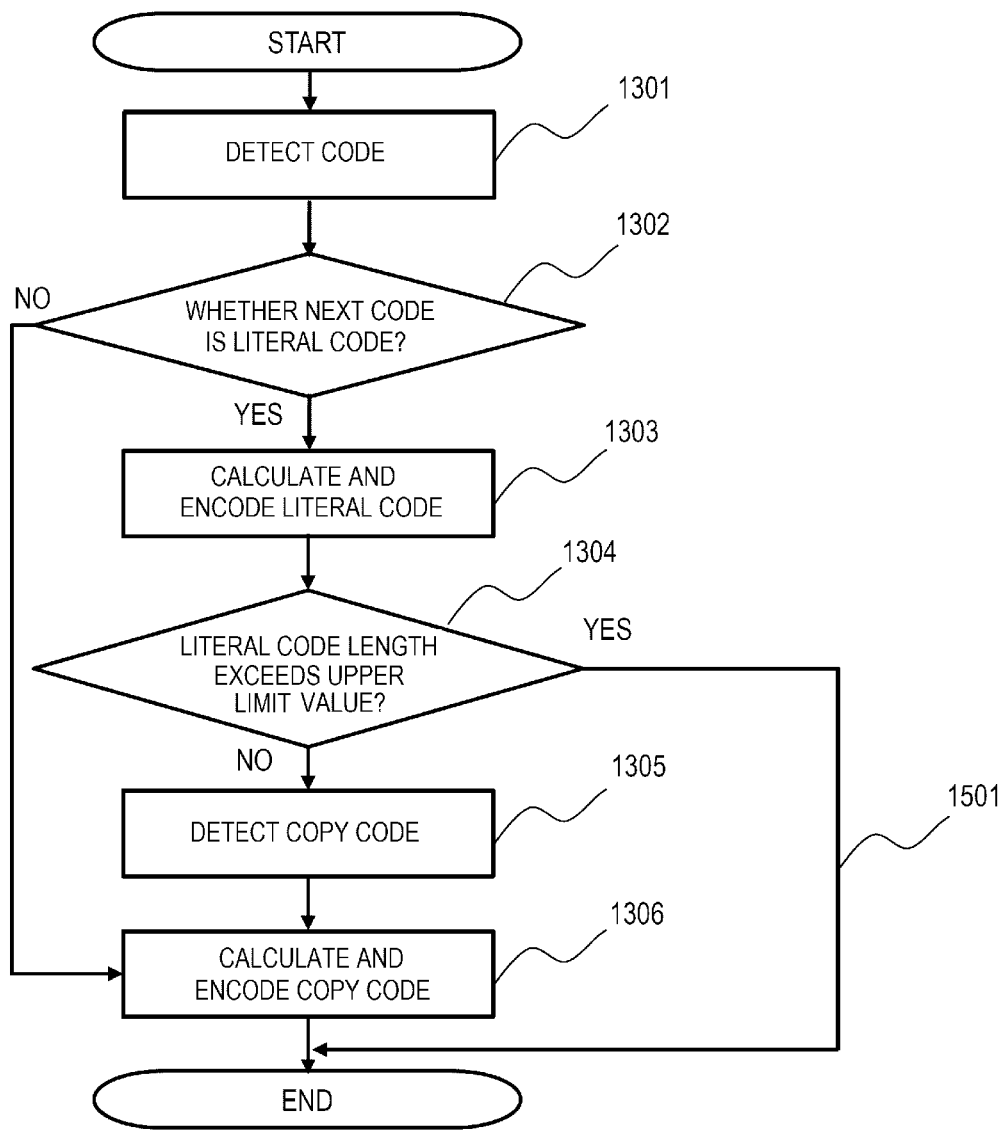
FIG. 15 shows a flowchart of compression processing for each packet of LZ4 according to the third embodiment of the invention.

FIG. 15 is a processing flow at the time of packet compression in the LZ4 format defined in the third embodiment. As a change from FIG. 13 of the second embodiment, when the determination in step 1304 is YES, no further encoding is performed, a process 1501 is passed, and the compression processing of the packet is ended.

Accordingly, it is possible to omit the section corresponding to the dummy copy code as compared with the LZ4 format in the second embodiment, and thus it is possible to improve the compression rate.

The invention is not limited to the above-descried embodiments, and includes various modifications. For example, the embodiments described above are described in detail for easy understanding of the invention, and the invention is not necessarily limited to those including all the configurations described above. A part of a configuration of one embodiment can be replaced with a configuration of another embodiment, and the configuration of another embodiment can be added to the configuration of one embodiment.

A part of the configuration of one embodiment may be added, deleted, or replaced with another configuration. The configurations, functions, processing units, processing means, or the like may be implemented by hardware by designing a part or all of them with, for example, an integrated circuit. The above-described configurations, functions, and the like may also be implemented by software by interpreting and executing a program that implements the functions using a processor. Information such as a program, a table, and a file for realizing each function can be placed in a recording device such as a memory, a hard disk, or a solid state drive (SSD), or in a recording medium such as an IC card, an SD card, or a DVD.

Further, control lines and signal lines show those considered to be necessary for the description, and not all the control lines and the signal lines are necessarily shown on the product. In practice, it may be considered that almost all the configurations are connected to each other.

What is claimed is:

1. A system for improving reliability of a data storage system, comprising:
    an interface;
    a compression circuit configured to generate sequentially compressed data by compressing received data received via the interface; and
    a decompression circuit configured to confirm data consistency by decompressing the sequentially compressed data before storing the sequentially compressed data in a storage drive, wherein
    the compression circuit sequentially executes a compression task on the received data to generate the sequentially compressed data, sequentially generates packets of the sequentially compressed data, and transfers the packets to the decompression circuit, and
    the decompression circuit sequentially receives the packets and starts a decompression task on the packets before all the packets derived from the received data are sequentially generated by the compression circuit.

2. The system according to claim 1, wherein
    the compression circuit sequentially generates the packets in a manner that at least a part of the packets has a size equal to or smaller than an upper limit length set in advance.

3. The system according to claim 2, wherein
    a first format and a second format of the packets are defined,
    the first format includes a literal code unit where a part of the received data is encoded and that has a length equal to or less than the upper limit length, and a copy code unit indicating a position and a length of repetitive data in the received data, and
    the second format includes the literal code unit having the upper limit length without indicating repetitive data in the received data, and a part indicating the second format.

4. The system according to claim 3, wherein
    the part indicating the second format is a dummy copy code portion that is inserted instead of the copy code unit and indicates non-copy.

5. The system according to claim 3, wherein
    the first format and the second format each include a part indicating a literal code length in the packets and a part indicating a copy code length in the packets, and
    the part indicating the second format is a part indicating the copy code length, and indicates that the copy code length is 0.

6. The system according to claim 3, wherein
    the first format and the second format each include a part indicating a literal code length in the packets,
    the part indicating the literal code length includes a bit string of a prescribed number indicating the literal code length in the packets, and
    the upper limit length is a maximum value of a code length that can be expressed by the bit string.

7. The system according to claim 2, wherein
    compression processing performance is monitored based on a compression result of the compression circuit, and
    the upper limit length is updated based on compression performance of the compression circuit.

8. A method for improving reliability of a data storage system, the method comprising:
    compressing, by a compression circuit, received data to generate packets of sequentially compressed data; and
    checking, by a decompression circuit, data consistency by decompressing the packets of the sequentially compressed data before storing the packets of sequentially compressed data in a storage drive, wherein,
    the decompressing is performed sequentially on the sequentially compressed data and is performed before all the packets derived from the received data are sequentially generated by the compression circuit.

\* \* \* \* \*